US005410208A

United States Patent [19]

Walters et al.

[11] Patent Number: 5,410,208

[45] Date of Patent: Apr. 25, 1995

[54] ULTRASOUND TRANSDUCERS WITH REDUCED SIDELOBES AND METHOD FOR MANUFACTURE THEREOF

[75] Inventors: Worth B. Walters; Sevig Ayter, both of Cupertino; John A. Hossack, Palo Alto; Kathy J. Jackson, Fremont; Jing Liu, Sunnyvale, all of Calif.

[73] Assignee: Acuson Corporation, Mountain View, Calif.

[21] Appl. No.: 46,606

[22] Filed: Apr. 12, 1993

[51] Int. Cl.[6] .............................................. H01L 41/08

[52] U.S. Cl. ..................................... 310/334; 310/335; 310/358; 310/369

[58] Field of Search ................................ 310/334–337, 310/327, 365, 367–369, 357–359, 324

[56] References Cited

U.S. PATENT DOCUMENTS

| | | | |
|---|---|---|---|
| 2,249,933 | 7/1941 | Bechmann | 310/369 X |
| 2,928,068 | 3/1960 | Samsel | 310/358 X |
| 2,956,184 | 10/1960 | Pollack | 310/369 |
| 3,166,731 | 1/1965 | Joy | 310/334 |
| 3,794,866 | 2/1974 | McElroy et al. | 310/369 X |
| 4,425,525 | 1/1984 | Smith et al. | 310/336 |
| 4,460,841 | 7/1984 | Smith et al. | 310/334 |
| 4,509,153 | 4/1985 | Weight | 310/357 X |
| 4,518,889 | 5/1985 | 'T Hoen et al. | 310/357 |
| 4,701,658 | 10/1987 | Ringmacher et al. | 310/369 X |
| 4,734,963 | 4/1988 | Ishiyama | 310/365 X |
| 4,961,252 | 10/1990 | Hsu et al. | 310/359 X |
| 5,038,068 | 8/1991 | Kushida et al. | 310/334 |
| 5,045,746 | 9/1991 | Wersing et al. | 310/334 |
| 5,075,641 | 12/1991 | Weber et al. | 310/324 X |
| 5,185,589 | 2/1993 | Krishnaswamy et al. | 310/324 X |
| 5,233,259 | 8/1993 | Krishnasawamy et al. | 310/365 X |
| 5,250,869 | 10/1993 | Ishikawa et al. | 310/334 |

OTHER PUBLICATIONS

"Foundations of Microwave Engineering", R. E. Collin, 2nd ed., McGraw Hill, 1992, pp. 370–386.

"Use of Photolithography and Chemical Etching in the Preparation of Miniature Piezoelectric Devices from Lead Zirconate Titanate (PZT) Ceramics", S. E. Trolier, M. S. Thesis, Pennsylvania State Univ., 1987.

"Laser Micromachining of Modified PbTiO3 Ceramic in KOH Water Solution", T. Shiosaki et al., Journal of Applied Physics, vol. 22, 1983, pp. 109–112.

"Design and Fabrication of Ultrasonic Transducers and Transducer Arrays", Alan R. Selfridge, Ph.D. Thesis, Stanford Univ., 1982, pp. 108–128.

"Transducer Arrays Suitable for Acoustic Imaging", Charles S. DeSilets, Ph.D. Thesis, Stanford Univ., 1978, pp. 85–109.

"Connectivity and Piezoelectric–Pyroelectric Composites", R. E. Newnham et al., Materials Research Bulletin, vol. 13, pp. 525–536, 1978.

"Transient Radiation from Pistons in an Infinite Planar Baffle", Peter R. Stepanishen, The Journal of the Acoustical Society of America, vol. 49, No. 5, (Part 2), 1971, pp. 1629–1638.

"Spatial Response of Arbitrarily Electroded Piezoelectric Plates by Plane-Wave Decomposition", Behzad Noorbehesht et al., Dept. of Electrical and Computer Engineering, Univ. of California, Ultrasonic Imaging 2, 1980, pp. 102–121.

"A Simple Way to Eliminate Diffraction Lobes Emitted by Ultrasonic Transducers", Franklin D. Martin et al., Dept. of Physics, The Univ. of Tennessee, J. Acoust., Soc. Am. 70(6), Dec., 1981, pp. 1788–1793.

"Diffraction from Rectangular Transducer", Wave Propagation with Finite Exciting Sources, Chap. 3, Sec. 3.2, pp. 175–180.

Radiation Pattern of Partially electroded Piezoelectric transducers, by Noorbehesht, JASA 70(6), Dec. 1981 pp. 1789–1791.

Reply to "Radiation Pattern of Partially eletroded Piezoelectric transducers", by Breazeale et al, JASA 70(6), Dec. 1981, pp. 1791–1793.

*Primary Examiner*—Mark O. Budd
*Attorney, Agent, or Firm*—Willian Brinks Hofer Gilson & Lione

[57] ABSTRACT

A transducer has tapered piezoelectric layer sides in order to reduce the sidelobe levels. In addition, matching layers disposed on the piezoelectric layer may similarly be tapered to further increase performance. Alternative to tapering the piezoelectric layer, the top electrode and/or the matching layers may be reduced in size relative to the piezoelectric layer such that they generate a wave which destructively interferes with the undesirable lateral wave. There are also described methods for manufacturing a reduced sidelobe transducer.

42 Claims, 4 Drawing Sheets

ULTRASOUND TRANSDUCERS WITH REDUCED SIDELOBES AND METHOD FOR MANUFACTURE THEREOF

FIELD OF THE INVENTION

This invention relates to transducers and more particularly to the control of undesirable sidelobes in ultrasound transducers.

BACKGROUND OF THE INVENTION

Ultrasound machines are often used for observing organs in the human body. Typically, these machines contain transducer arrays for converting electrical signals into pressure waves or vice versa. Generally, the transducer array is in the form of a hand-held probe which may be adjusted in position to direct the ultrasound beam to the region of interest. As seen in FIGS. 1, 2 and 4, a transducer array 10 may have, for example, 128 transducer elements 12 in the azimuthal direction for generating an ultrasound beam. Adapted from radar terminology, the x, y, and z directions are referred to as the azimuthal, elevation, and range directions, respectively.

The transducer element 12, typically rectangular in cross-section, may comprise a first electrode 14, a second electrode 16, a piezoelectric layer 18, and one or more acoustic matching layers 20, 22. The transducer elements 12 are disposed on a backing block 24. In addition, a mechanical lens 26 may be placed on the matching layers to help confine the generated beam in the y-z plane. Examples of prior art transducer structures are shown in Charles S. DeSilets, *Transducer Arrays Suitable for Acoustic Imaging,* Ph.D. Thesis, Stanford University (1978) and Alan R. Selfridge, *Design and Fabrication of Ultrasonic Transducers and Transducer Arrays,* Ph.D. Thesis, Stanford University (1982).

Individual elements 12 can be electrically excited by electrodes 14 and 16, with different amplitudes and phases to steer and focus the ultrasound beam in the x-z plane. Terminals 28 and 30 may be connected to each of the electrodes 14 and 16 for providing the electrical excitation of the element 12. Terminal 28 may provide the hot wire or excitation signal, and terminal 30 may provide the ground. As a result, a primary wave 31 is provided in the z-direction.

The force distribution of the face 32 of the transducer element 12, and the acoustic and geometrical parameters of the mechanical lens 26 describe the radiation pattern in the elevation direction, as a function of an angle in the y-z plane. The finite width of the transducer element 12 in the y-direction causes the sides 36 and 38 of the transducer element 12 to move freely. This motion, in turn, creates lateral waves 40, propagating along the y-direction. These lateral waves 40, propagating through the composite structure of piezoelectric layer 18 and matching layers 20 and 22, may have a phase velocity greater than that of the external medium (e.g., the patient being examined) and may excite an undesirable secondary propagating wave and "leak" into the external medium.

The direction of the secondary propagating wave in the external medium is given by the expression $\Theta=\arcsin(vo/vl)$, where $\Theta$ is measured with respect to the normal of the transducer face 32 in the y-z plane, vo is the velocity of the wave in the acoustic medium, and vl is the velocity of the lateral wave. This "leaky" wave will increase the sidelobe levels around the angle $\Theta$. As an example, for the piezoelectric material PZT-5H, the phase velocity of the lateral wave is approximately 3000 meters per second. This is approximately twice the phase velocity in the human body of 1500 meters per second. Consequently, a secondary wave 42 caused by lateral wave 40 propagates at an angle $\Theta$ of 30 degrees.

The sidelobe levels of individual elements of an ultrasound transducer are of particular concern in applications where a strong reflector in the object of interest, e.g., cartilage, may be located outside the main acoustic beam. In such a case, the reflections from the object of interest, e.g., soft tissue, may be comparable to signals coming from a strong reflector, such as the cartilage, outside the region of interest. As a result, the generated image is less accurate and may contain artifact.

Referring also to FIG. 3, the main lobe of a typical ultrasonic transducer radiation pattern 44 is shown. Due to the contribution of lateral waves, the radiation pattern outlined by region 46 results. In the absence of the lateral wave, the radiation pattern would have followed curve 48. The radiation pattern 44 of a transducer is primarily related to the field distribution across its aperture. For continuous wave or very narrow band excitations, the radiation pattern is related to the aperture function by Fourier transform relationships. For wide band excitation, one may use, for example, superposition to integrate the field distributions at each frequency.

A fixed-focus lens may scale the radiation pattern by modifying the phase of the aperture distribution, but the general sidelobe characteristics are governed by the amplitude distribution of the aperture. In addition, apodization may be used to improve the radiation pattern by shaping the aperture distribution. Apodization results in varying the electric field between electrodes 14 and 16 along the elevation direction. However, these prior art techniques fall short because lateral waves still may be generated and contribute to undesirable sidelobe levels and may result in a less accurate image.

SUMMARY OF THE INVENTION

Consequently, it is a primary objective of this invention to provide an ultrasonic transducer which better eliminates the effects of lateral waves. To this end, one aspect of this invention suppresses the generation of lateral waves.

Alternatively, another aspect of the present invention substantially cancels the effects of a "leaky" wave by destructively interfering it with a secondary wave created by the transducer.

To achieve the above objectives and other ends, there is provided in one embodiment of the invention, an acoustic transducer having a piezoelectric layer, the sides of the piezoelectric layer tapering such that the piezoelectric upper surface has a surface area less than the piezoelectric lower surface. A first electrode is disposed on the piezoelectric lower surface and a second electrode is disposed on the piezoelectric upper surface. This taper construction has been found to suppress the generation of lateral waves.

In another embodiment, there is provided a transducer having a piezoelectric layer, a first electrode disposed on the piezoelectric lower surface, and a second electrode disposed on the piezoelectric upper surface. The second electrode, however, is smaller in surface area than the piezoelectric upper surface such that the second electrode generates a wave which destructively interferes with a lateral wave generated by the transducer.

In a further embodiment, there is provided a transducer having a piezoelectric layer, a first electrode disposed on the piezoelectric lower surface, a second electrode disposed on the piezoelectric upper surface, and a matching layer disposed on the second electrode. The matching layer is smaller in surface area than the piezoelectric upper surface such that the matching layer generates a wave which destructively interferes with a lateral wave generated by the transducer.

There is also provided a method for constructing a transducer for use in an acoustic imaging system having reduced sidelobes. The method utilizes tapering of the piezoelectric sides such that the piezoelectric upper surface has a surface area less than the piezoelectric lower surface, disposing a first electrode on the piezoelectric lower surface, and disposing a second electrode on the piezoelectric upper surface. Another method for constructing a transducer having reduced sidelobes is provided comprising disposing a first electrode on the lower surface of a piezoelectric layer, disposing a second electrode on the piezoelectric upper surface, and tapering the piezoelectric sides such that the piezoelectric upper surface is smaller in surface area than the piezoelectric lower surface. A further method for constructing a transducer having reduced sidelobes is provided comprising disposing a first electrode on a lower surface of a piezoelectric layer, disposing on the piezoelectric upper surface a second electrode being smaller in surface area than the piezoelectric upper surface, wherein the second electrode generates a wave which destructively interferes with a lateral wave generated by the transducer.

These objectives and other attributes and advantages of the invention may be further understood with reference to the following detailed description of embodiments of the invention taken in combination with the drawings, in which:

DESCRIPTION OF PREFERRED EMBODIMENTS

Figure 1:
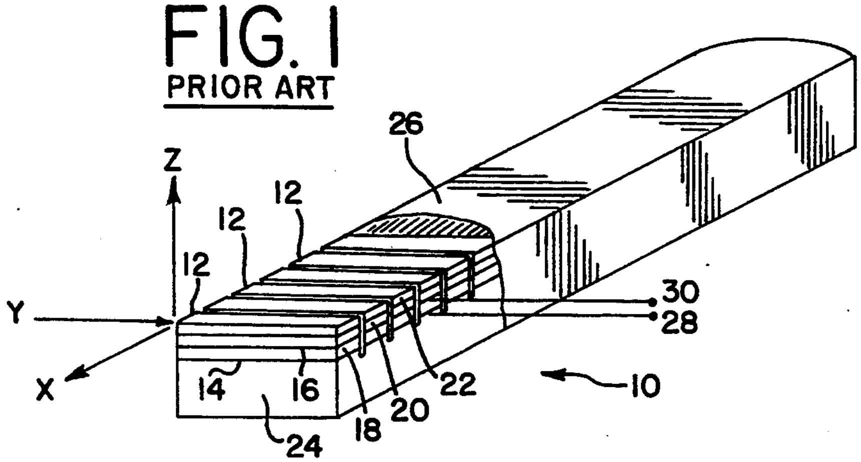
FIG. 1 PRIOR ART
FIG. 1 is a perspective view of a prior art transducer array.
Figure 2:
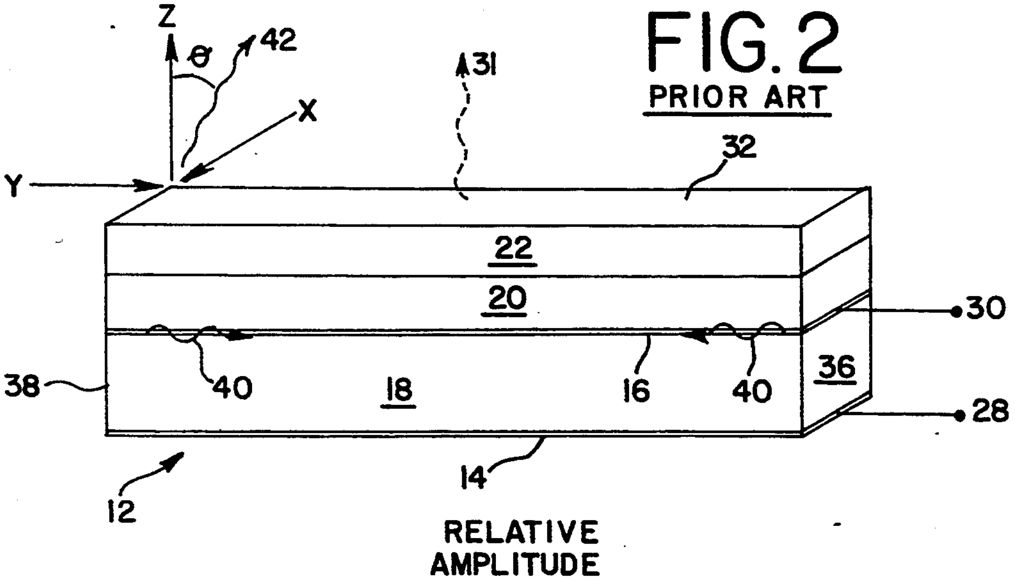
FIG. 2 PRIOR ART
FIG. 2 is a perspective view of a prior art transducer element.
Figure 3:
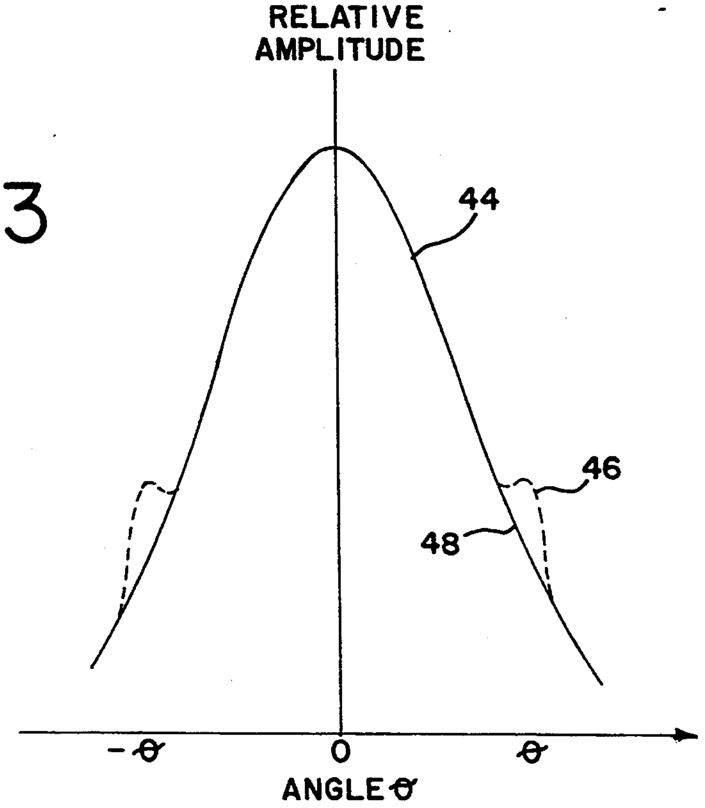
FIG. 3 is a graphical representation of a radiation pattern for a transducer.
Figure 4:
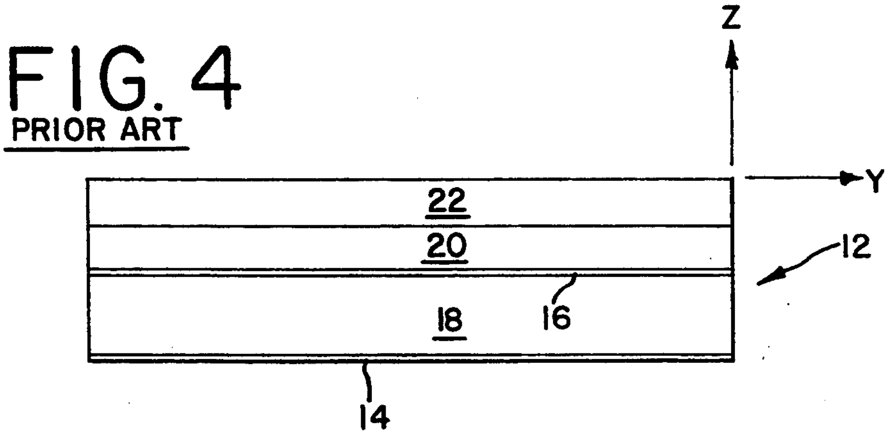
FIG. 4 PRIOR ART
FIG. 4 is a cross-sectional view of the transducer element of FIG. 2 taken along the y-z plane.
Figure 5:
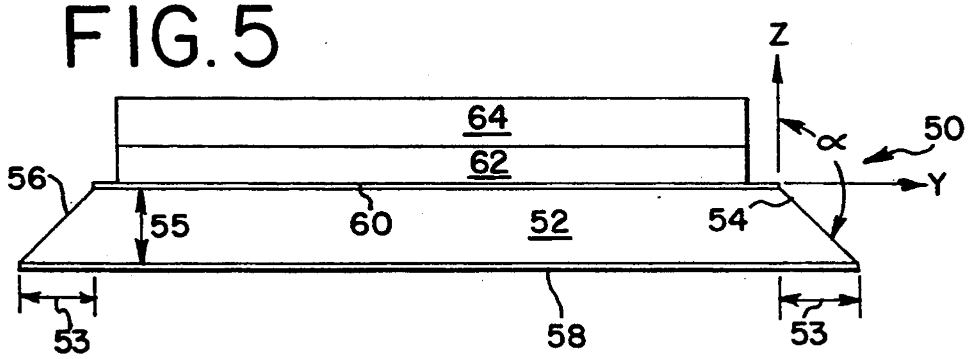
FIG. 5 is a cross-sectional view of a first embodiment of a transducer element of the present invention taken along the y-z plane showing a piezoelectric layer with tapered sides.

Referring to FIG. 5, in one embodiment there is shown a cross-sectional view taken along the y-z plane of a reduced sidelobe transducer element 50 having a piezoelectric layer 52. The piezoelectric layer 52 has two sides 54, 56 which are tapered in shape.

For a taper to provide a smooth transition between the lower and upper surfaces of the piezoelectric layer 52 in order to suppress the generation of lateral waves, it has been found that the taper length 53 should be a length of at least a wavelength of the lateral wave 40. Because the piezoelectric layer thickness 55 is generally on the order of a half a wavelength of the lateral wave 40, the maximum angle $\alpha$ for tapering the sides 54, 56 has been found to be approximately 120 degrees relative to the primary acoustic propagation direction or z-direction. In principle, the smaller the angle $\alpha$, the better the suppression of the generation of lateral waves. However, the smaller the angle $\alpha$, the larger the space that should be allocated for the tapered length 53. For example, in a transducer where the piezoelectric layer is 0.15 mm thick, a 97 degree taper will require an additional taper length 53 of 1.222 mm. Thus, the most desirable taper should be greater than 90 degrees but less than 120 degrees relative the primary acoustic propagation direction. However, the most preferable taper has been found to result in an angle approximately 97 to 98 degrees relative to the propagation direction, so that the tapered length 53 is not too large from a practical standpoint.

Although the taper of the sides 54, 56 is shown to be planar in shape, the taper may also comprise a series of planar segments, a staircase (or stepped) shape, a non-planar shape, or any combination thereof. As a result of the taper, the piezoelectric upper surface and piezoelectric lower surface have unequal surface area. Preferably, the piezoelectric lower and upper surfaces are parallel to one another.

A first electrode 58 is disposed below the lower surface of the piezoelectric layer 52. In addition, a second electrode 60 is disposed on the upper surface of the piezoelectric layer 52. The second electrode 60 is shown as being approximately coextensive in size with the piezoelectric upper surface. However, as will be described later, the second electrode 60 may be smaller than the piezoelectric upper surface in order to generate destructive interference with any residual lateral wave that may be generated despite the taper of the sides 54, 56 of the piezoelectric element 52 to further reduce sidelobe levels, especially if the taper angle $\alpha$ is large (e.g., approximately 120 degrees). A first matching layer 62 as well as a second matching layer 64 may be disposed on the second electrode 60 to further increase performance of the transducer element 50.

Figure 6:
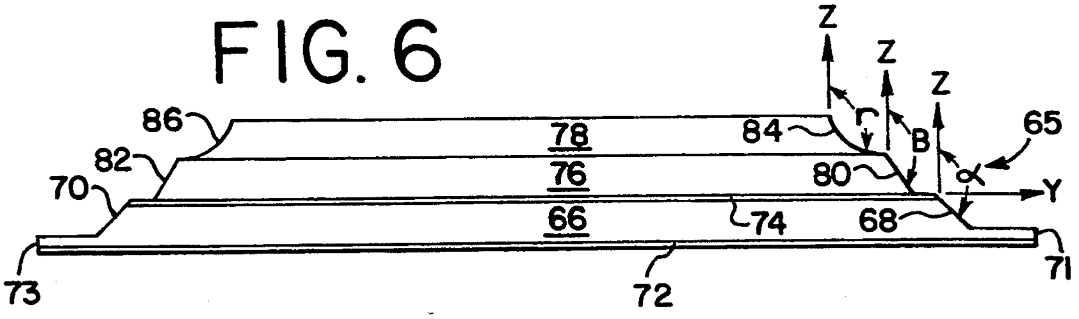
FIG. 6 is a cross-sectional view of a second embodiment of a transducer element of the present invention taken along the y-z plane showing a piezoelectric layer and two matching layers having tapered ends.

Referring now to FIG. 6, there is shown an alternate embodiment of the present invention. The transducer element 65 has a piezoelectric layer 66 with two sides 68 and 70 which comprise three planar segments. Again, the preferred taper should be greater than about 90 degrees but less than about 120 degrees relative to the primary acoustic propagation direction, as shown by angle $\alpha$. The taper is most preferably approximately 97 to 98 degrees relative to the primary acoustic propagation direction. In addition, a partial portion 71, 73 of the piezoelectric layer 66 may remain untapered on each of the sides 68 and 70. However, the portions 73, 74 should be less than one half the thickness of the piezoelectric layer 66 to prevent the generation of lateral waves within the frequency band of operation of the transducer 65. The angle $\alpha$ is measured with respect to the tapered portion of the sides 68 and 70. A first electrode 72 and a second electrode 74 are disposed on the piezoelectric lower and upper surfaces, respectively.

A first matching layer 76 may be disposed on the second electrode 74. The first matching layer upper surface has a surface area less than the first matching layer lower surface. In addition, a second matching layer 78 may be disposed on the first matching layer 76 where the second matching layer upper surface has a surface area less than the second matching layer lower surface. The ends 80 and 82 of the first matching layer 76 are shown to be planar in shape. In addition, the ends 84 and 86 of the second matching layer 78 are shown to be nonplanar in shape. However, as with the piezoelectric sides 68 and 70, these ends 80, 82, 84, and 86 may be either planar in shape, may comprise a series of planar segments, may be staircase or stepped in shape, may be nonplanar in shape, or any combination thereof.

To optimize suppression of sidelobe levels, different portions of the transducer can be tapered with different profiles, as shown in FIG. 6. Depending on the elastic properties of the individual layer materials, the profile of the taper can be adjusted separately in each layer. For cases where the dominant structure for the lateral wave propagation is the piezoelectric layer, tapering the piezoelectric layer alone may be sufficient. Preferably, the piezoelectric layer sides form an angle $\alpha$ greater than 90 degrees but less than 120 degrees relative to the primary acoustic propagation direction. Otherwise, other layers in the transducer structure may be tapered as shown in FIG. 6.

A matching layer typically has a thickness of one-fourth wavelength of the lateral wave 40, which is generally on the order of half of the thickness of the piezoelectric layer or less. Because the taper length should be at least one wavelength in order to help suppress the sidelobe levels as mentioned before, the matching layer ends for each respective matching layers 76 and 78 used should form an angle greater than 90 degrees but less than 104 degrees relative to the primary acoustic propagation direction, as shown by angles $\beta$ and $\Gamma$. For some applications, it may be sufficient to merely taper the ends of the first matching layer 76 rather than both matching layers 76, 78. In addition, the angle and extent of the taper may vary from element to element of a given transducer probe or within an individual element itself.

Figure 7:
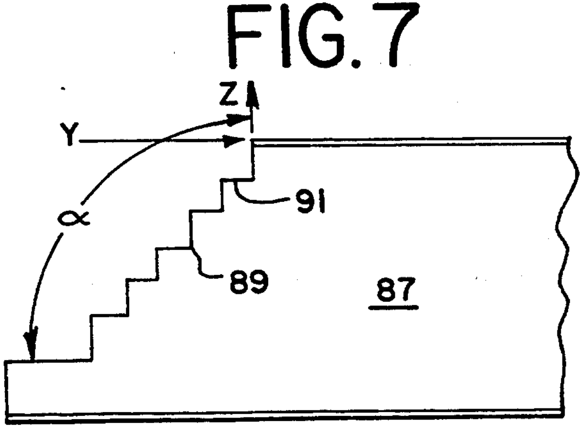
FIG. 7 is a partial cross-sectional view of a third embodiment of a transducer element of the present invention taken along the y-z plane showing a piezoelectric layer having a tapered stepped pattern.

FIG. 7 shows an alternate embodiment where the sides 89 of the piezoelectric layer 87 are staircase in shape. The step height should be a small fraction of a wavelength to provide smooth taper transition to prevent the generation of lateral waves. The larger number of steps 91, the smoother the taper transition. From a manufacturing standpoint, one-fortieth wavelength for the height of each step 91 has been found to be satisfactory. Assuming the thickness of the piezoelectric layer is approximately a half wavelength, then twenty steps will be required to form the tapered sides between the upper piezoelectric surface and the lower piezoelectric surface. Preferably, the steps 91 are similar in dimension. If the height of the steps 91 is too large, then the undesirable lateral waves will be generated. As mentioned before, the preferred taper angle should be greater than 90 degrees but less than 120 degrees relative to the primary acoustic propagation direction. However, it is most desirable that the taper be approximately 97 to 98 degrees relative to the primary acoustic propagation direction.

Tapering may be achieved using a dicing saw, successively dicing away the material to create the desired taper, such as the staircase pattern of FIG. 7. One can also achieve the required taper by using a special dicing blade which has the required taper profile, and trimming the side of the element in one pass. In order to make the special dicing blade, one reconfigures the blade of a standard dicing blade to match the desired taper profile of the layer to be tapered. Alternatively, one can tilt the layer to be tapered and use a standard dicing blade having a thickness of 25 to 200 microns, as manufactured by Disco Abrasive Systems, Inc. of Japan or Kulicke and Soffa Industries, Inc. of Israel. By tilting the layer, one is capable of cutting the edge of the respective layer obliquely.

In addition to the above described techniques, laser ablation, laser induced etching techniques as well as chemical etchers such as HCl may be used to etch away the undesired portion of the transducer sides. For example, an Excimer laser may be used to perform the required tapering of the layers forming the transducer structure. For laser induced etching, one can use a CW Argon laser such as NEC GLC-2023 where the sample is in KOH solution as described in the article of T. Shiosaki et. al., "Laser Micromachining of Modified PbTi03 Ceramic in KOH Water Solution" Journal of Applied Physics, Vol. 22 (1983). For chemical etching, one may use the technique described in S. E. Trolier, "Use of Photolithography and Chemical Etching in the Preparation of Miniature Piezoelectric Devices from Lead Zirconate Titanate (PZT) Ceramics" M.S. Thesis, Pennsylvania State Univ. (1987).

A first electrode may then be disposed on the tapered piezoelectric layer. Then, a second electrode may be disposed on the tapered piezoelectric layer. As in commonly known in the industry, electrodes may be disposed on a piezoelectric layer by use of sputtering techniques. One or more matching layers may then be disposed on the second electrode. These matching layers may also be tapered by the use of the above described techniques. Alternatively, the first electrode, piezoelectric layer, second electrode, and matching layers may be first assembled prior to tapering. Then, the desired tapers in the transducer structure may be performed by one of the above described techniques.

In addition to tapering the sides of layers forming the transducer structure, one may also substantially cancel the effect of a "leaky" wave by destructively interfering it with a secondary wave created by the transducer. As will be described, the second electrode and/or any of the matching layers may be made smaller in surface area than the piezoelectric upper surface such that a secondary wave is generated to substantially cancel the effects of the "leaky" wave.

Figure 8:
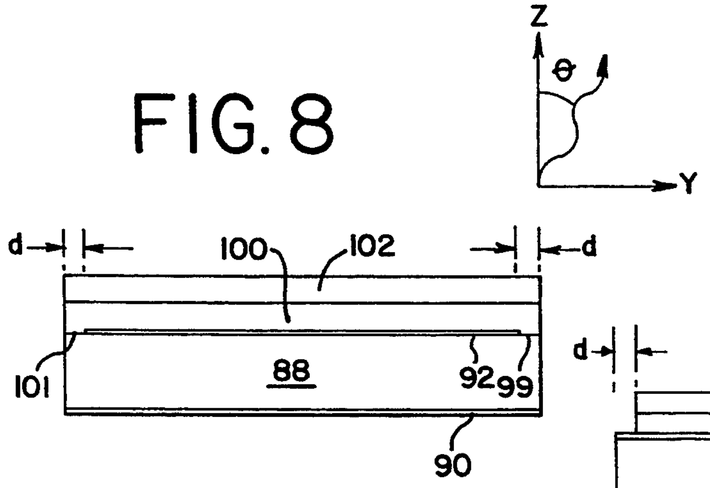
FIG. 8 is a cross-sectional view of a fourth embodiment of a transducer element of the present invention having a top electrode smaller in surface area than the bottom electrode and having matching layers coextensive in size with the piezoelectric layer.

Now referring to FIG. 8, there is shown an alternate embodiment of the present invention. A piezoelectric layer 88 is shown having a first electrode 90 disposed on the piezoelectric lower surface and a second electrode 92 disposed on the piezoelectric upper surface. The piezoelectric layer 88 has a piezoelectric upper and lower surface of equal dimension as shown in FIG. 8. In the alternative, the piezoelectric layer may incorporate a taper as described earlier.

The second electrode 92 generates a second lateral wave which destructively interferes with a lateral wave generated by the sides of piezoelectric transducer layer 88. The second electrode 92 is smaller than the piezoelectric upper surface by a distance d at each end causing this destructive interference. The distance d is approximated by the velocity of the wave in the external medium multiplied by AT, which is half the pulse period defined by the operating frequency of the transducer, divided by the sine of the direction of the propagating wave in the external medium.

Figure 11:
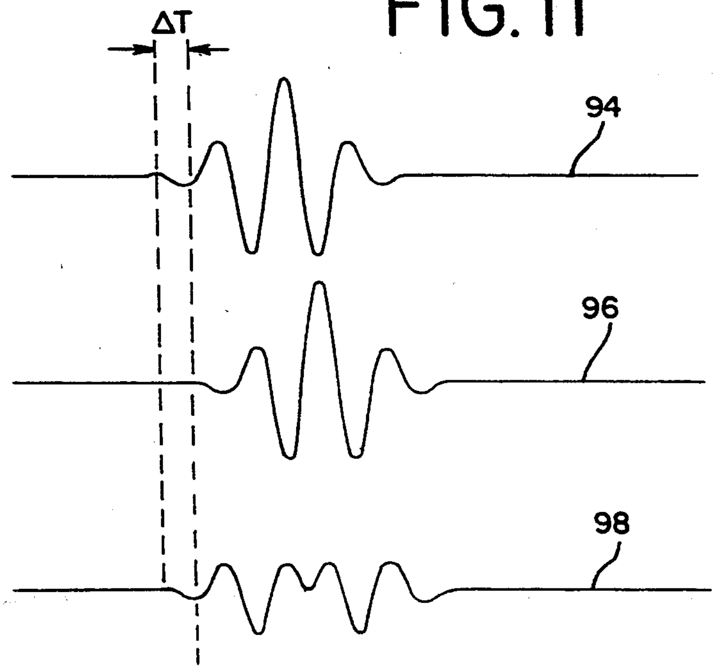
FIG. 11 shows graphical representations of pulses caused by mechanical and electrical discontinuities and the destructive resultant signal of the embodiments shown in FIGS. 8, 9 and 10.

As shown in FIG. 11, a first pulse 94 is generated by the electrical discontinuity in the second electrode 92 (e.g., the ends of second electrode 92 which are shorter than the piezoelectric layer 88 by a distance d at each end) and acts as a source for a lateral wave. This first pulse 94 is purposefully generated to destructively interfere with the undesirable second pulse or lateral wave 96 which is generated by the physical discontinuity in the piezoelectric layer 88. These two pulses 94 and 96 will be separated by a time difference $\Delta T$ when the observation point is far from the transducer (i.e where the observation point is greater than about fifty times the width d), and thus the resultant lateral wave is reduced as shown by waveform 98. Consequently, the regions 99 and 101 of FIG. 8 extending from the second electrode 92, each having a width d, provides the necessary time or phase delay to cause destructive interference at the point of observation around the angle $\Theta$.

The transducer element may also have matching layers 100 and 102 disposed on the second electrode 92. It should be noted that matching layer 100 may be in contact with piezoelectric layer 88 along regions 99 and 101. Although the matching layers are shown to be rectangular in cross-section, they may also taper in the manner discussed earlier to further suppress the contribution of sidelobe levels. In addition, although the matching layers 100 and 102 are shown in FIG. 8 to have the same width as piezoelectric layer 88, they do not have to have the same width as the piezoelectric layer.

Figure 9:
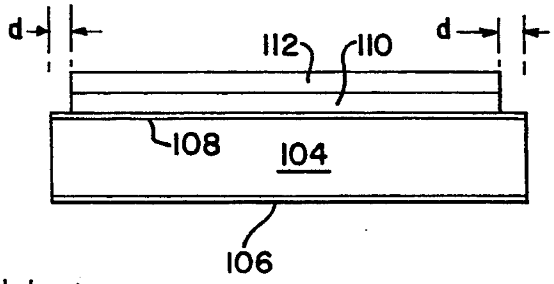
FIG. 9 is a cross-sectional view of a fifth embodiment of a transducer element of the present invention wherein the matching layers are smaller in surface area than the piezoelectric layer.

Referring to FIG. 9, there is shown an alternate embodiment where the first pulse 94 of FIG. 11 is generated by the mechanical discontinuity in the matching layer rather than the discontinuity in the second electrode, as was done in the embodiment of FIG. 8 in order to cancel the effect of the "leaky" wave. That is, the matching layer is chosen to have a certain dimension such that it generates a wave which destructively interferes with the lateral wave generated by the piezoelectric layer 104. The piezoelectric layer 104 has a first electrode 106 and a second electrode 108 of equal surface area. A first matching layer 110 is shortened by the width d, calculated by the equation referred to earlier, at each end of the matching layer in order to create the desired destructive interference with the lateral wave produced by the discontinuity in the piezoelectric layer 104. A second matching layer 112 may also be disposed on the first matching layer to further increase performance. In addition, one or all of the piezoelectric layer 104, the first matching layer 110, and the second matching layer 112 may be tapered in shape as described earlier.

Figure 10:
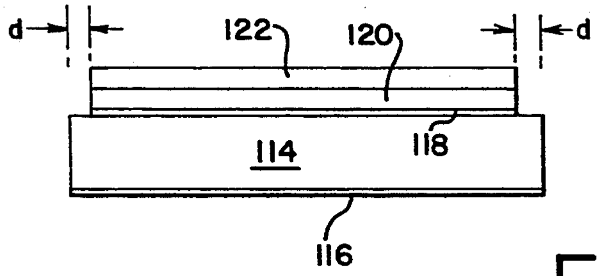
FIG. 10 is a cross-sectional view of a sixth embodiment of a transducer element of the present invention having a top electrode smaller in surface area than the bottom electrode and having matching layers smaller in size than the piezoelectric layer.

Referring now to FIG. 10, there is shown an alternate embodiment wherein both the second electrode 118 and the matching layer 120 are both shorter than piezoelectric layer 114 by a distance d at each end, calculated by the equation referred to above. The first electrode 116 is similar in dimension along the x-y plane to piezoelectric layer 114. In addition, a second matching layer 122 may be disposed on first matching layer 120. The first and second matching layers may have the same width. Alternatively, both matching layers may taper in the manner discussed earlier. Both the discontinuity in the second electrode 118 as well as the matching layers 120 and 122 create the desired destructive interference with the lateral wave produced by the discontinuity in the piezoelectric layer 114.

Figure 13:
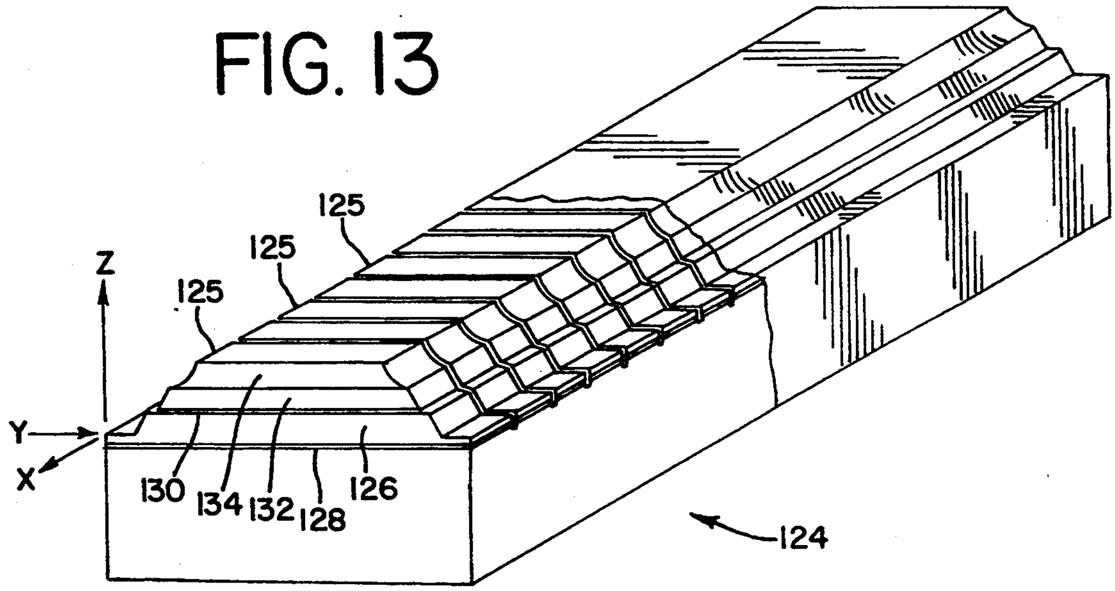
FIG. 13 is a perspective view of an array of transducer elements shown in FIG. 12.
Figure 12:
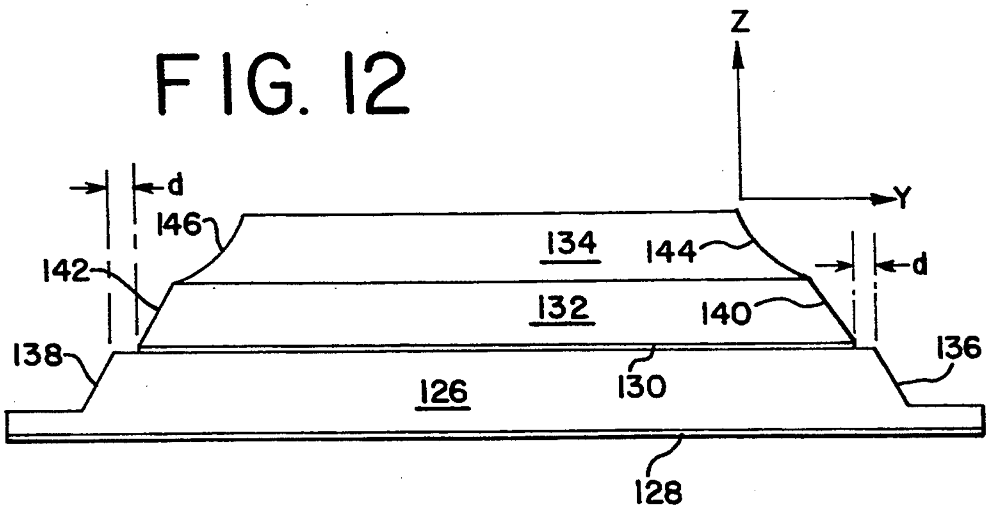
FIG. 12 is a cross-sectional view of a seventh embodiment of a transducer element of the present invention showing a piezoelectric layer and two matching layers having tapered ends and having a top electrode smaller in surface area than the bottom electrode.

Referring now to FIGS. 12 and 13, there is shown an array 124 of transducer elements 125 wherein the piezoelectric layer 126, the first matching layer 132, and the second matching layer 134 are tapered at each of the sides or ends 136, 138, 140, 142, 144, and 146. Each of these tapered sides or ends helps suppress the generation of lateral waves contributing to sidelobe levels. In addition, the second electrode 130 is smaller than the first electrode by the distance d at each end, calculated by the above referred to equation. As a result, any undesirable lateral wave generated by the piezoelectric layer 126 may be further suppressed by purposefully generating a secondary wave caused by the electrical discontinuity in the second electrode 130.

The piezoelectric layer may be formed of any piezoelectric ceramic material such as lead zirconate titanate (PZT) or lead metaniobate. In addition, the piezoelectric layer may be formed of composite material such as the composite material described by R. E. Newnham et al. "Connectivity and Piezoelectric-Pyroelectric Composites", Materials Research Bulletin, Vol. 13 at 525–36 (1978) and R. E. Newnham et al., "Flexible Composite Transducers", Materials Research Bulletin, Vol. 13 at 599–607 (1978).

Should composite material be used, the transducer element may provide a polarization profile which decreases toward the edges of the transducer element, resulting in apodization. An example of this polarization of the piezoelectric layer is described in U.S. Pat. No. 4,518,889 to 'T Hoen issued May 21, 1985. When used in accordance with the principles of this invention, both the tapering of the sides of the transducer layers or the creation of a secondary discontinuity which destructively interferes with the mechanical discontinuity of the element coupled with the polarization profile of the composite material may serve to further reduce sidelobe levels.

The invention has been described viewing the transducer element as a transmitter. However, since the transducer may operate as a receiver as well, the phenomenon can equally be explained considering the transducer as a receiver. It is to be understood that the forms of the invention described herewith are to be taken as preferred examples and that various changes in the shape, size, and arrangements of parts may be resorted to, without departing from the spirit of the invention or scope of the claims.

We claim:

1. An acoustic transducer comprising:
- a piezoelectric layer defining an upper surface, a lower surface, and at least two sides, said at least two sides being shaped such that said upper surface has a surface area less than said lower surface;
- a first electrode disposed on said lower surface; and
- a second electrode disposed on said upper surface;
- wherein said sides form an angle greater than about 90 degrees and less than about 120 degrees relative to a primary acoustic propagation direction.

2. The transducer of claim 1 wherein said upper surface and said lower surface are generally parallel to one another.

3. The transducer of claim 1 wherein said sides are shaped to form a taper along an elevation direction.

4. The transducer of claim 1 wherein said sides form an angle approximately 98 degrees relative to said primary acoustic propagation direction.

5. The transducer of claim 1 wherein said sides are planar in shape.

6. The transducer of claim 1 wherein said sides comprise a series of planar segments.

7. The transducer of claim 6 wherein said planar segments are stepped in shape.

8. The transducer of claim 1 wherein said sides are nonplanar in shape.

9. The transducer of claim 1 further comprising at least one matching layer disposed on said second electrode.

10. The transducer of claim 9 wherein said matching layer defines a surface area that is less than a surface area defined by said upper surface of said piezoelectric layer.

11. The transducer of claim 1 further comprising a first matching layer disposed on said second electrode, said first matching layer defining a top surface and a bottom surface, wherein the area of said top surface is less than the area of said bottom surface.

12. The transducer of claim 11 wherein said first matching layer further comprises ends which are planar in shape.

13. The transducer of claim 11 wherein said first matching layer further comprises at least two ends spaced apart from one another along an elevation direction, each of said at least two sides comprises a series of planar segments.

14. The transducer of claim 11 wherein said first matching layer further comprises at least two ends spaced apart from one another along an elevation direction, each of said at least two sides are nonplanar in shape.

15. The transducer of claim 11 further comprising a second matching layer disposed on said top surface of said first matching layer, said second matching layer defining a lower surface and an upper surface, wherein the area defined by said upper surface of said second matching layer has a surface area less than the area defined by said lower surface of said second matching layer.

16. The transducer of claim 11 wherein said first matching layer comprises at least two ends spaced apart from one another along an elevation direction which form an angle greater than about 90 degrees and less than about 104 degrees relative to said primary acoustic propagation direction.

17. The transducer of claim 1 wherein said piezoelectric layer comprises piezoelectric ceramic material.

18. The transducer of claim 1 wherein said piezoelectric layer comprises composite material.

19. The transducer of claim 18 wherein said composite material has a polarization profile which decreases toward said sides of said piezoelectric layer.

20. An acoustic transducer comprising:
- a piezoelectric layer having an upper surface and a lower surface;
- a first electrode disposed on said lower surface; and
- a second electrode disposed on said upper surface wherein said second electrode generates a wave which destructively interferes with a lateral wave generated by said piezoelectric layer, said second electrode being of a reduced size as compared with said upper surface of said piezoelectric layer by a distance at each end of said second electrode along an elevation direction, said distance being estimated by the wave velocity in an external medium multiplied by half the pulse period defined by a transducer operating frequency divided by the sine of the angle between the direction of a secondary propagating wave in said external medium caused by said lateral wave and a range direction.

21. The transducer of claim 20 wherein said upper surface and lower surface of said piezoelectric layer are generally parallel to one another.

22. The transducer of claim 21 wherein said upper surface and lower surface of said piezoelectric layer have equal surface area.

23. The transducer of claim 21 wherein said upper surface of said piezoelectric layer defines a surface area that is less than a surface area defined by said lower surface of said piezoelectric layer.

24. The transducer of claim 23 wherein said piezoelectric layer further comprises at least two sides spaced from one another along an elevation direction which are planar in shape.

25. The transducer of claim 23 wherein said piezoelectric layer further comprises at least two sides spaced from one another along an elevation direction which comprise a series of planar segments.

26. The transducer of claim 23 wherein said piezoelectric layer further comprises at least two sides spaced from one another along an elevation direction which are nonplanar in shape.

27. The transducer of claim 22 further comprising at least one matching layer disposed on said second electrode.

28. The transducer of claim 23 further comprising at least one matching layer disposed on said second electrode.

29. The transducer of claim 22 further comprising a first matching layer disposed on said second electrode, said first matching layer having a top surface and a bottom surface, wherein said top surface defines a surface area that is less than a surface area defined by said bottom surface.

30. The transducer of claim 29 further comprising a second matching layer disposed on said top surface of said first matching layer, said second matching layer having an upper surface and a lower surface, wherein said upper surface of said second matching layer defines a surface area that is less than a surface area defined by said lower surface of said second matching layer.

31. The transducer of claim 23 further comprising a first matching layer disposed on said second electrode, said first matching layer having a top surface and a bottom surface, wherein said top surface defines a surface area that is less than a surface area defined by said bottom surface.

32. The transducer of claim 31 further comprising a second matching layer disposed on said top surface of said first matching layer, said second matching layer having an upper surface and a lower surface, wherein said upper surface of said second matching layer defines a surface area that is less than a surface area defined by said lower surface of said second matching layer.

33. An acoustic transducer comprising:

a piezoelectric layer having an upper surface and a lower surface;

a first electrode disposed on said lower surface;

a second electrode disposed on said upper surface; and a matching layer disposed on said second electrode, said matching layer having a top surface and a bottom surface, said bottom surface of said matching layer being smaller in surface area than said upper surface of said piezoelectric layer such that said matching layer generates a wave which destructively interferes with a lateral wave generated by said piezoelectric layer, said matching layer being smaller than said upper surface of said piezoelectric layer by a distance at each end of said matching layer along an elevation direction, said distance being approximated by the velocity of the wave in an external medium multiplied by half the pulse period defined by an operating frequency of said transducer divided by the sine of the angle between the direction of a secondary propagating wave in said external medium caused by said lateral wave and a range direction.

34. The transducer of claim 33 wherein said second electrode is smaller than said upper surface of said piezoelectric layer by said distance.

35. The transducer of claim 34 wherein said upper surface of said piezoelectric layer is smaller in surface area than said lower surface of said piezoelectric layer and said piezoelectric layer further comprises at least two sides spaced from one another along an elevation direction which are tapered in shape.

36. The transducer of claim 35 wherein said top surface of said matching layer is smaller in surface area than said bottom surface of said matching layer and said matching layer further comprises at least two ends spaced from one another along an elevation direction which are tapered in shape.

37. An array of transducers having sidelobe reduction for use in an acoustic imaging system comprising:

a plurality of transducer elements each having a piezoelectric layer with an upper surface, a lower surface, and at least two sides, said upper surface being smaller in surface area and generally parallel to said lower surface;

a plurality of first electrodes, each one of said first electrodes disposed on said lower surface of a corresponding one of said plurality of transducer elements;

a plurality of second electrodes, each one of said second electrodes disposed on said upper surface of a corresponding one of said plurality of transducer elements;

wherein each of said sides of said piezoelectric layer forms an angle greater than about 90 degrees and less than about 120 degrees relative to a primary acoustic propagation direction and said sides suppress the generation of lateral waves.

38. The array of transducers of claim 37 further comprising at least one matching layer disposed on each of said second electrodes.

39. The array of transducers of claim 37 further comprising a first matching layer disposed on each of said second electrodes, said first matching layer defining a bottom surface and a top surface, wherein said top surface of said first matching layer defines a surface area which is less than a surface area defined by said bottom surface of said first matching layer.

40. The array of transducers of claim 39 wherein said first matching layer comprises at least two ends spaced apart from one another along an elevation direction which form an angle greater than about 90 degrees and less than about 104 degrees relative to said primary acoustic propagation direction.

41. An array of transducers having sidelobe reduction for use in an acoustic imaging system comprising:

a plurality of transducer elements each having a piezoelectric layer with an upper surface and a lower surface;

a plurality of first electrodes, each one of said first electrodes disposed on said piezoelectric lower surface of a corresponding one of said plurality of transducer elements;

a plurality of second electrodes, each one of said second electrodes disposed on said upper surface of a corresponding one of said plurality of transducer elements, each of said second electrodes being smaller in surface area than said upper surfaces wherein each of said second electrodes generates a wave which destructively interferes with a lateral wave generated by each of said piezoelectric layers, each of said second electrodes being smaller than each of said upper surfaces of said piezoelectric layer by a distance at each end of said second electrode along an elevation direction, said distance being approximated by the wave velocity in an external medium times half the pulse period defined by an operating frequency of said transducer divided by the sine of the angle between the direction of a secondary propagating wave in said external medium caused by said lateral wave and a range direction.

42. The array of transducers of claim 41 further comprising at least one matching layer disposed on each of said second electrodes.

* * * * *

UNITED STATES PATENT AND TRADEMARK OFFICE

CERTIFICATE OF CORRECTION

PATENT NO. : 5,410,208

DATED : April 25, 1995

INVENTOR(S) : Worth B. Walters

It is certified that error appears in the above-indentified patent and that said Letters Patent is hereby corrected as shown below:

In column 7, line 26, delete "A" and substitute --Δ--.

In column 7, line 40, delete "i.e" and substitute --i.e.--.

Signed and Sealed this

Twelfth Day of March, 1996

Attest:

Bruce Lehman

BRUCE LEHMAN

*Attesting Officer* *Commissioner of Patents and Trademarks*